United States Patent [19]

Herrick et al.

[11] Patent Number: 5,259,925
[45] Date of Patent: Nov. 9, 1993

[54] METHOD OF CLEANING A PLURALITY OF SEMICONDUCTOR DEVICES

[75] Inventors: Robert W. Herrick, Hazelwood; Joseph L. Levy, University City, both of Mo.; Danny J. Krebs, Arnold, Md.

[73] Assignee: McDonnell Douglas Corporation, St. Louis, Mo.

[21] Appl. No.: 894,479

[22] Filed: Jun. 5, 1992

[51] Int. Cl.⁵ .................. H01L 21/302; B44C 1/22
[52] U.S. Cl. ................. 156/659.1; 437/226; 437/129; 148/DIG. 28; 148/DIG. 131
[58] Field of Search ............. 156/659.1, 226; 437/226, 227, 129, 906; 148/DIG. 28, DIG. 131

[56] References Cited

U.S. PATENT DOCUMENTS

| | | | |
|---|---|---|---|
| 4,237,601 | 12/1980 | Woolhouse et al. | 437/226 |
| 4,610,079 | 9/1986 | Abe et al. | 437/227 |
| 4,865,684 | 9/1989 | Boudma | 156/659.1 |
| 4,869,780 | 9/1989 | Yang et al. | 437/129 |
| 4,883,771 | 11/1989 | Kumabe et al. | 437/129 |
| 4,904,617 | 2/1990 | Muschke | 437/226 |
| 4,994,142 | 2/1991 | Appelbaum | 156/659.1 |
| 5,047,364 | 9/1991 | Hattori | 437/226 |

FOREIGN PATENT DOCUMENTS

| | | | |
|---|---|---|---|
| 53-147467 | 12/1978 | Japan | 437/226 |
| 55-91138 | 7/1980 | Japan | 437/226 |
| 62-272582 | 11/1987 | Japan | . |
| 63-392026 | 4/1988 | Japan | 437/226 |
| 62-101420 | 11/1988 | Japan | . |
| 63-276276 | 11/1988 | Japan | 437/226 |

OTHER PUBLICATIONS

Silicon Processing for the VLSI ERA; vol. 1; pp. 407-409, 418-425; Wolf et al, 1986.
GaInAsP/Inp Stripe-Geometry laser with a reactive ion etched facet; Coldren et al; Appl. Phys. Lett 37 (8); 15 Oct. 1980.

Primary Examiner—Brian E. Hearn
Assistant Examiner—Michael Trinh
Attorney, Agent, or Firm—Guy R. Gosnell; Benjamin Hudson, Jr.; Timothy N. Courson

[57] ABSTRACT

A method for cleaving semiconductor devices along planes accurately positioned. Resist is applied to a major surface of the semiconductor device and a mask is projected upon the resist covered major surface. The mask is opaque in those regions in which no cleave is desired. Following the exposure of the resist, the removal of the mask and the development of the resist, an ion beam is positioned incident upon the semiconductor surface such that ion beam etching occurs in the areas in which no resist covers the semiconductor structure. Once a sufficient depth is etched in the areas not covered with resist such that the strength of the semiconductor structure in those areas is significantly less than in those areas covered by resist, the ion beam etching process is ended and the resist is stripped from the semiconductor structure. Subsequently, force is applied within the area in which the ion beam etching occurred to cleave the semiconductor structure within that region. Such cleaving may occur either prior or subsequent to etching of facets for the semiconductor devices.

9 Claims, 1 Drawing Sheet

METHOD OF CLEAVING A PLURALITY OF SEMICONDUCTOR DEVICES

STATEMENT OF GOVERNMENTAL INTEREST

The Government has rights in this invention pursuant to Contract No. F29601-88-C-0039 awarded by the Department of the Air Force.

BACKGROUND OF THE INVENTION

The present invention relates generally to a method for cleaving a semiconductor device and more particularly to a method for cleaving semiconductor devices having etched facets wherein the position of the cleave may be accurately selected.

In many modern applications, opto-electronic integration requires the use of accurate etching and cleaving techniques for semiconductor materials so as to have precise control of the dimensions of the emitting facet and the position of the cleave relative thereto. Exemplary applications in which such precise positioning of the cleave is necessary includes semiconductor devices in which a laser is integrated with other electrical or optical components.

In many modern semiconductor fabrication techniques, a wafer from which numerous, individual semiconductor devices will be constructed is processed through conventional semiconductor techniques such that a plurality of epitaxial layers are grown or deposited upon the surface of the wafer. Subsequently a mask is designed for the wafer such that deposited photoresist may be, exposed and developed upon selected surfaces of the wafer. Thereinafter, the wafer is exposed to conventional etching techniques. Following the etching, the photoresist may be removed such that the wafer is patterned into a plurality of semiconductor devices; all of which are still connected by the wafer substrate.

For example, should the individual semiconductor devices which have been patterned upon the wafer be semiconductor laser diodes, the etching process would have produced a pair of opposing etched facets positioned at the longitudinal faces of the patterned semiconductor laser diode. It is desirable to perform as many common steps of the semiconductor devices fabrication processes with the individual semiconductor devices still joined upon the wafer substrate so that each individual device was processed simultaneously. An example of such a common processing step which it would be desirable to perform simultaneously to all the patterned semiconductor devices would be the coating of the etched facets with high-reflectivity coatings to maintain appropriate oscillation within the semiconductor laser diode for proper laser operation. By performing a single deposition of such high-reflectivity coating on all patterned semiconductor devices which are still connected upon the wafer substrate, the processing proceeds more rapidly and efficiently than prior art processing techniques whereby each individual semiconductor device patterned upon the surface of the wafer is physically separated from every other semiconductor device and individually coated with facet coatings. Such separation and individual processing of each patterned semiconductor device requires much greater time and thus results in a corresponding decrease in efficiency of production of such semiconductor devices.

Additionally, in order to increase the number of semiconductor devices harvested from a single wafer, it is desirable to position the semiconductor devices as close to one another as possible, however, they must still able to be separated without destroying the function of the semiconductor device itself.

In order to position many individual semiconductor devices upon a single wafer and to perform numerous processing steps upon each patterned semiconductor device simultaneously while such individual semiconductor devices are still connected upon the wafer substrate, it is desirable that there be an accurate method of cleaving the individual semiconductor devices from one another following their common processing steps such that the individual semiconductor devices are not damaged during the cleaving process.

An additional illustration in which accurate cleaving position is desirable may be illustrated with reference to FIG. 1 in which an etched facet is illustrated in side cross sectional view. As the light emitted from the emitting facet of a semiconductor laser diode has a relatively large divergence, the ledge adjacent to the emitting facet must be relatively narrow such that the diverging output light does not strike the surface of the ledge and either be absorbed or reflected at an angle which would disturb the light's far field pattern. Thus, a cleave is necessary to separate the semiconductor laser device at a point such that the ledge is sufficiently narrow to not intercept the emitted light. Typically, the width of the ledge should be less than the distance between the base of the ledge and the quantum well from which the light is emitted. Thus, if the quantum well is positioned one mircometer from the ledge, the ledge should be less than one micrometer in width. A cleave must be very accurately positioned, as a cleave positioned too far from the emitting facet would make the resulting ledge too wide such that is disturbs the output of the laser diode, while if the cleave is positioned too close to the emitting facet, the emitting facet and its coatings may be cleaved off.

There have been several previous cleaving techniques utilized to separate such individual semiconductor devices from a single wafer substrate. One such technique involves scribing between the semiconductor devices and then applying a force along the length of the scribe in a direction perpendicular to the surface of the wafer so as to crack the wafer along the scribe. This skip-scribing technique is not acceptable for making good quality laser facets such as those utilized with optical devices as the scribe damages the facet and leaves a fractured surface, but may be utilized with the electrical devices.

An alternative cleaving technique is to again scribe a mark in the wafer but instead of applying force along the entire length of the scribe mark, applying pressure to one end of the scribed mark so as to crack the wafer at that point and then shifting the force applied so as to urge the crack to travel the length of the scribed mark. By using such a cleaving technique, the position of the cleave cannot accurately be determined prior to the cleaving and should the cleave vary substantially from the mark scribed in the wafer, the individual semiconductor device may be irretrievably damaged by the cleave. Furthermore, such cleaves must follow atomic crystal planes and therefore cannot be accurately registered, in angle, to the photolithographically - defined features of the processed wafer.

An alternative method for precisely positioning cleaves in semiconductor lasers was described in an article entitled, "Etching of Deep Grooves for the Precise Positioning of Cleaves in Semiconductor Layers" by J. E. Bauers, B. R. Hemenway, and D. P. Witt published in Applied Physics Letters, Volume 46, No. 5, page 453-455 on Mar. 1, 1985. The technique described by Bauers, et al. involves the etching of grooves into a semiconductor substrate followed by the application of force along the deep grooves so as to separate the wafer along the groove. The groove was etched using photoelectrochemical etching in which the semiconductor wafer is immersed in a conducting solution with a low etch rate. Subsequently, a bias is applied to the substrate to deplete the surface of electrons and light with a photon energy greater than the substrate bandgap energy is applied to the region of the substrate of the sample to be etched. Thus, a mask must be applied to the substrate in those areas in which no etching and subsequently no groove is desired. Such a process is continued until a very deep groove is produced at which time the wafer is removed from the conducting solution the bias is removed from the substrate, and the light is removed. Subsequently, the wafer may be flexed so as to induce cleaves along the lines of the grooves. While such a cleaving process may produce reliably positioned cleaves such a process also suffers from several deficiencies, including the inefficiencies involved in precisely aligning the mask along the back side or the substrate side of the semiconductor devices, as well as the length of time required to etched such deep grooves in the semiconductor device.

It would be desirable to develop a cleaving method for use with semiconductor devices in which cleaves could be accurately and reliably positioned. It would also be desirable if such a cleaving method could separate numerous, closely positioned semiconductor devices which have been patterned upon a semiconductor wafer following their processing in common.

SUMMARY

There is provided by this invention a method for cleaving semiconductor devices along planes accurately positioned. In one embodiment of this method, the desired position of the cleave is identified following the etching of the emitting facets of the semiconductor device such that a ledge exists between the etched facet and cleave position. Subsequently, resist is applied to the surface of the semiconductor device and an image of a mask is projected onto the resist, with light projected in those areas in which a cleave is desired. Following the exposure of the resist and development of the resist, an ion beam is positioned incident upon the semiconductor surface such that ion beam etching occurs in the areas in which resist has been removed from the semiconductor surface. Once a sufficient depth is etched in the areas not covered with resist such that the strength of the semiconductor structure in those areas is significantly less than in those areas covered by resist, the ion beam etching process is ended and the resist is stripped from the semiconductor structure. Subsequently, force is applied within the area in which the ion beam etching occurred in order to cleave the semiconductor structure within that region. Additionally, the ion beam etching forms angled side walls having a groove positioned at the base of the angled side wall. If the cleaving force is positioned approximate to the groove, the cleave will occur along the length of the groove. In this fashion, accurately positioned cleaves may be introduced to separate the semiconductor device from the remainder of the semiconductor structure such that a plurality of semiconductor devices may be formed upon a common semiconductor wafer and common processing steps can be simultaneously performed on each individual semiconductor device prior to their separation. Such semiconductor devices could be thereinafter separated by the aforementioned cleaving process without damaging the individual semiconductor devices.

An alternative method for cleaving such semiconductor devices is also disclosed in which resist is applied to a semiconductor structure and an image of a mask, opaque in those areas in which semiconductor devices are desired, is projected upon the resist. Subsequently, resist is exposed and developed. An ion beam is thereafter positioned incident thereupon for etching those areas not covered with resist. Following the etching of a sufficient depth within the semiconductor structure such that the strength of the structure wherein the etch occurred is substantially less than that of the semiconductor structure covered with resist, the ion beam is removed and a etching process for etching the emitting facets of the semiconductor device is employed such as chemically assisted ion beam etching. Following the etching of the emitting facets, the resist is stripped and force is applied within the area initially etched by ion beam etching such that a cleave occurs within that region. With such ion beam etching, angled side walls are formed once again having a groove positioned at the base of the angled side walls. Should the force be applied approximate to the groove, the cleave will occur along the length of the groove. In this fashion, accurately positioned cleaves may also be formed in a fashion that no ledge is formed adjacent to the emitting facets.

DETAILED DESCRIPTION OF THE PREFERRED EMBODIMENT

Figure 1:
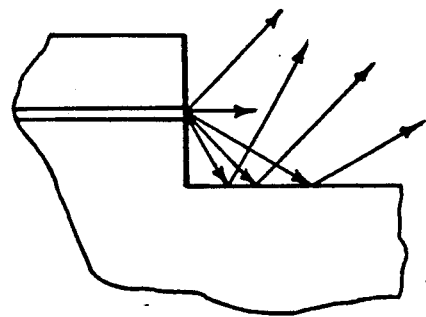
FIG. 1 is a side, cross sectional view of a semiconductor laser diode in which the cleave is positioned at an excessive distance from the emitting facet.
Figure 2:
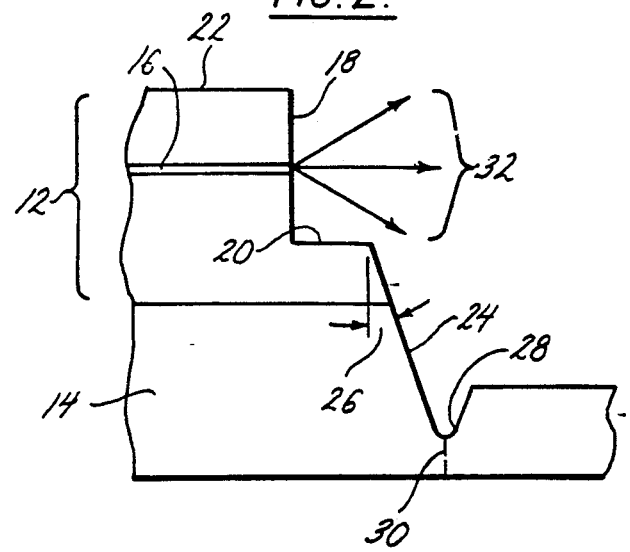
FIG. 2 is a side, cross sectional view of a semiconductor device following the etching of the device in accordance with the principles of the invention disclosed herein.

Referring now to FIG. 2, there is shown a perforation etch formed through the use of the hereinafter described method. Initially, a plurality of epitaxial layers 12 are grown or deposited upon a semiconductor substrate 14 as is well known to those skilled in the art. While the semiconductor layers 12 may be selected so as to form any desired semiconductor device, a semiconductor laser diode will be utilized to explain the perforation etch process. In order to form a semiconductor laser diode, a quantum well region 16 is deposited within the plurality of semiconductor layers. Subsequently, the semiconductor device is etched as is well known to those skilled in the art such that etched facets 18 are formed at longitudinally opposed faces of the now defined semiconductor device. The etch, however, is controlled such that is does not etch through each epitaxial layers and semiconductor substrate, but instead etches only a predetermined below the quantum well region 16. The method by which the etch is done may be any of those well known to those skilled in the art such as chemically assisted ion beam etching (CAIBE).

Following the etching process and any other processing steps which are desirable to perform with the plurality of semiconductor devices attached to a common substrate, the desired position of the cleaves used to separate the defined semiconductor device from the remainder of the semiconductor substrate is selected. Typically, as shown in FIG. 2, a ledge 20 having a width less than the distance of the quantum well 16 from the base of the ledge 20 is desirable with the cleave occurring along the edge of the ledge 20 opposite the emitting facet 18 of the semiconductor diode laser. Once the cleave position has been determined, resist is applied to the etched semiconductor surface. The resist may be of any of those types well known to those skilled in the art such as a standard thick resist, such a Shipley 1375, which is spun on, or a tri-level resist in which an initial layer of resist is spun on to planarize the surface followed by the deposition of a layer of oxide and a deposition of a second layer of resist. With a tri-level resist, a plasma etch is subsequently utilized to pattern the resist so that there are substantially vertical side walls at the edges of the resist pattern. The resist, after being spun on, is subsequently soft baked and exposed. A mask is thereinafter projected upon the exposed resist such that during the subsequent exposure step, the resist which is not overlaid with an opaque portion of the mask will be chemically altered so that it may be removed during the ensuing developing step. The mask should be designed such that resist is exposed and removed from the areas in which a cleave is desired. Additionally, the projection of the mask upon the resist may either be accomplished by contact lithography or projection lithography. The remaining unremoved resist is hard baked and ion beam etching, such as by means of an argon ion mill, is thereinafter utilized to etch the areas not overlayed with resist. Thus, ion beam etching occurs in the areas in which a cleave is desired. As shown in FIG. 2, a standard ion beam etching does not produce a strictly vertical side wall be instead produces a side wall 24 having an angle 26 of approximately 22° as measured from a normal to the surface of the semiconductor device. Additionally, the use of an ion beam etching technique produces a groove 28 at the base of the side wall 24. While the depth of the etch performed by the ion beam etching technique may be any distance selected by the semiconductor device designer, the depth must be sufficient such that the strength in the area in which the ion beam etching occurred is significantly less than that in the areas of the semiconductor device previously overlayed with resist. Thus, a semiconductor device being approximately 100 micrometers thick and having a etched facet with a height of approximately 2.5 micrometers may have an etched depth from the ion beam etching process of approximately 4 micrometers which would reduce the strength in those areas to such a level that cleaving could readily occur within those areas. Once the proper etch depth has been accomplished with the ion beam etching process, the ion beam etching is stopped and the resist is stripped from the semiconductor device. Subsequently, forces may be applied normal to the surface of the semiconductor device within the area of the semiconductor device which was etched by the ion beam etching process so as to cleave the semiconductor device from the remainder of the semiconductor substrate 14.

The formation of a groove 28 at the base of the angled side wall 24 formed by the ion beam etching process introduces an area of further reduced strength such that if normal forces are applied to the semiconductor device within the proximity of the groove 28, the cleave will occur along the groove 28 itself so as to be reliably positioned in a consistent manner. Such a cleave is indicated by the dashed line 30 in FIG. 2.

The cleaving method previously described produces a cleave which may be accurately positioned such that the width of the ledge may be precisely controlled so as to not interfere with the emitted light 32 from the quantum well 16. Additionally, while the ion beam etching process forms an angled side wall 24, the angle 26 at which the side wall 24 forms with the horizontal semiconductor layers is much greater than the angle at which the emitted light 32 of the semiconductor diode laser diverges from the quantum well 16 such that the angled side wall 24 does not interfere with the emitted light 32.

Such a technique for cleaving semiconductor devices as described and illustrated in FIG. 2 may be utilized to separate a plurality of semiconductor devices which have been patterned upon a common semiconductor wafer. In this fashion, a number of common processing steps may be performed simultaneously to all the semiconductor devices prior to their separation. As the cleave planes may be precisely positioned with such a method the individual semiconductor devices may be positioned fairly closely relative to one another without damaging the devices during their separation. The common processing steps may occur either prior or subsequent to the etching of a groove along which cleaving will occur depending upon the type of processing step involved and the mask patterns developed for the processing step.

An example of such a standard semiconductor processing step which could be performed to a plurality of semiconductor devices prior to their separation from a common semiconductor wafer is the coating of the emitting facets with an anti-reflection coating. With reference to the steps of the perforation etch method previously described, the coating could be applied either immediately following the etching of the facet or following the ion beam etching and the stripping of the resist covering the semiconductor devices. In either instance, the anti-reflection coating would be applied to a plurality of semiconductor devices prior to their cleaving so as to decrease the processing time and increase the efficiency of the semiconductor device fabrication.

The actual force applied to the region in which the ion beam etching occurred may be applied through any of the conventional methods. Preferably, a device such as a Dynatex cleaver is utilized to apply a force along the entire length of the semiconductor device and to position the force applied approximate to the groove 28 formed at the base of the angled side wall 24 by ion beam etching such that the cleave occurs along the groove 28.

Figure 3:
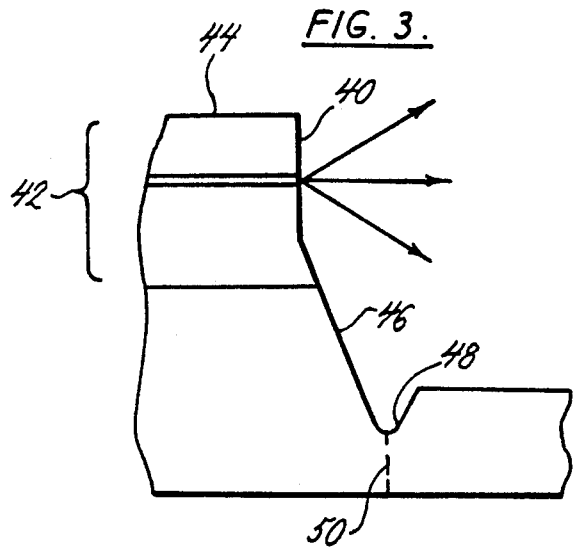
FIG. 3 is a side, cross sectional view of a semiconductor device following the etching of the device with an alternative method of the invention disclosed herein.

An alternative method for producing such an accurately positioned cleave may be accomplished as shown in FIG. 3 in which no ledge is allowed adjacent the emitting facet 40. In this alternative method, the semiconductor device, following the deposition of the plurality of the epitaxial layers 42 and the completion of any desired, preliminary processing steps to be performed on the unetched semiconductor device, has oxide deposited upon the epitaxial layers 42. Subsequently, photoresist is spun the oxide layer. The photoresist is then patterned as previously discussed by projecting a mask pattern on the resist, exposing the masked resist, and then removing the resist which was not under an opaque portion of the mask and was thus exposed. By means of reactive ion etching, the negative of the pattern of the resist is transferred to the underlying oxide by means of a reactive ion etch. The resist is then stripped, leaving a patterned oxide mask. The patterned oxide mask leaves exposed the portion of the semiconductor device in which a groove for cleaving is desired. An ion beam is thereinafter positioned incident upon the surface of the semiconductor structure such that ion beam etching occurs. Typically, a standard argon ion mill is utilized. The ion beam etching forms an area having angled side walls 46 having a groove 48 at the base of the side wall 46. While the etch depth may be selected by the designer to be any desirable etching depth with deeper etches providing greater decreases in strength of the semiconductor structure and easier cleaving while also requiring increased processing time. For the semiconductor structure previously discussed having a total thickness of approximately 100 micrometers, an etch depth from the ion beam etching process of approximately 4 micrometers is sufficient to significantly decrease the strength of the semiconductor device in those regions. Thereinafter, the ion beam etching is discontinued and additional processing steps common to the perforation etched semiconductor device may be performed. The emitting facet 40 is subsequently formed utilizing the same resist pattern which has already been formed on the first major surface 44 of the semiconductor device. While any method of etching a facet may be utilized, CAIBE may be utilized for forming a vertical emitting facet 40. As shown in FIG. 3, following the etching of the emitting facet 40, the etch accomplished by the initial ion beam etching process has been forced into the semiconductor structure by a distance equal to the height of the etched facet 40 while retaining its characteristic angled side wall 46 having a groove 48 at the base of the angled side wall 46. The height of the etched facet 40 may be selected to be any desirable value. Following the etching of the emitting facets, the oxide may be stripped from the semiconductor surface, and subsequent processing completed. Force can be applied within the region in which the initial ion beam etching occurred such that a cleave occurs to separate the semiconductor device from the remainder of the semiconductor structure. As explained earlier, should the force be positioned approximately to the groove 48 at the base of the angled side wall 46 the cleave will occur along the length of the groove 48 as indicated by the dashed line in FIG. 3. By utilizing this alternative method, a cleave may be accurately positioned such that a plurality of semiconductor devices may be formed from a single semiconductor wafer wherein the individual semiconductor devices may be positioned close relative to one another during their common processing steps and the cleave may be positioned between the adjacent semiconductor devices without harming the devices themselves. Additionally, this alternative cleaving method allows for the formation of the semiconductor devices having no ledge adjacent the emitting facets 40.

Although this has been illustrated and described specific detail and structure of operations, it is clearly understood that the same were merely for purposes of illustration and that changes and modifications may be readily made therein by those skilled in the art without departing from the spirit and the scope of this invention.

What is claimed is:

1. A method for cleaving a plurality of semiconductor devices from a common substrate comprising the steps of:
    a) overlaying a major surface of said semiconductor devices with a first photoresist such that each semiconductor device is overlayed with said first photoresist while areas between said semiconductor devices are not overlayed with said first photoresist;
    (b) etching, with an ion beam, said areas between said semiconductor devices which are not overlayed with said first photoresist;
    (c) overlaying a major surface of said semiconductor devices with a second photoresist such that each semiconductor device is overlayed with said second photoresist while areas between said semiconductor devices are not overlayed with said second photoresist;
    (d) etching, with a chemically assisted ion beam, said areas between said semiconductor devices which are not overlayed with said second photoresist such that facets are formed for said semiconductor devices;
    (e) removing said second photoresist following said etching and prior to said first photoresist deposition; and
    (f) applying a force normal to said major surface of said semiconductor devices such that said substrate is cleaved, said force being applied in said etched areas between said semiconductor devices which are not overlayed with photoresist.

2. A method for cleaving a plurality of semiconductor devices from a common substrate, as recited in claim 1 wherein said second photoresist overlaying step comprise the steps of:
    a) depositing said second photoresist on said major surface of said semiconductor device, and
    b) projecting upon said photoresist-covered major surface of said semiconductor devices a mask pattern, said mask pattern being opaque in areas overlying semiconductor devices and transparent in areas overlying areas between semiconductor devices.

3. A method for cleaving a plurality of semiconductor devices from a common substrate, as recited in claim 2, further comprising the steps of:
    a) exposing said second photoresist to radiation following the projections thereupon of said mask pattern; and
    b) developing said second photoresist prior to said chemically-assisted-ion-beam etching.

4. A method for cleaving a plurality of semiconductor devices from a common substrate comprising the steps of:
    a) overlaying a major surface of said semiconductor devices with a photoresist such that each semiconductor device is overlayed with said photoresist while areas between said semiconductor devices are not overlayed with said photoresist, wherein said major surface of said semiconductor devices is oppositely disposed from said common substrate;
    b) etching, with an ion beam, said areas between said semiconductor devices which are not overlayed with said photoresist;

c) etching, with a chemically assisted ion beam, said areas between said semiconductor devices which are not overlayed with said photoresist such that facets are formed for said semiconductor devices; and d) applying a force normal to said major surface of said semiconductor devices such that said substrate is cleaved, said force being applied in said etched areas between said semiconductor devices which are not overlayed with said photoresist.

5. A method for cleaving a plurality of semiconductor devices from a common substrate, as recited in claim 4, wherein the overlaying step comprises the steps of:

a) depositing said photoresist on said major surface of said semiconductor device; and b) projecting upon said photoresist covered major surface of said semiconductor devices a mask pattern, said mask pattern being opaque in areas overlying semiconductor devices and transparent in areas overlying areas between semiconductor devices.

6. A method for cleaving a plurality of semiconductor devices from a common substrate, as recited in claim 5, further comprising the steps of:

a) exposing said photoresist to radiation following the projection thereupon of said mask pattern; and b) developing said exposed photoresist.

7. A method for cleaving a plurality of semiconductor devices from a common substrate, as recited in claim 6, further comprising the step of removing said developed photoresist following said ion beam etching.

8. A method for cleaving a plurality of semiconductor devices from a common substrate, as recited in claim 2, wherein said photoresist is comprised of a tri-level photoresist.

9. A method for cleaving a plurality of semiconductor devices from a common substrate, as recited in claim 2, wherein said ion beam etching utilizes an Argon ion mill.

* * * * *

UNITED STATES PATENT AND TRADEMARK OFFICE
CERTIFICATE OF CORRECTION

PATENT NO. : 5,259,925
DATED : November 9, 1993
INVENTOR(S) : Robert W. Herrick, Joseph L. Levy, Danny J. Krebs It is certified that error appears in the above-indentified patent and that said Letters Patent is hereby corrected as shown below:

On the Title Page, Item [54], and Column 1, lines 1-2, should read;

METHOD OF CLEAVING A PLURALITY OF SEMICONDUCTOR DEVICES

Signed and Sealed this

Nineteenth Day of April, 1994

Attest:

BRUCE LEHMAN

*Attesting Officer*     *Commissioner of Patents and Trademarks*